United States Patent
Zhao et al.

(10) Patent No.: US 12,439,551 B2
(45) Date of Patent: Oct. 7, 2025

(54) LIQUID COOLING PLATE ASSEMBLY AND SERVER

(71) Applicants: INVENTEC (PUDONG) TECHNOLOGY CORPORATION, Shanghai (CN); INVENTEC CORPORATION, Taipei (TW)

(72) Inventors: Jingnan Zhao, Shanghai (CN); Yi-Dong Ji, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 214 days.

(21) Appl. No.: 18/244,712

(22) Filed: Sep. 11, 2023

(65) Prior Publication Data

US 2025/0081391 A1  Mar. 6, 2025

(30) Foreign Application Priority Data

Aug. 28, 2023  (CN) .......................... 202311095596.3

(51) Int. Cl.
*H05K 7/20* (2006.01)

(52) U.S. Cl.
CPC ..... *H05K 7/20263* (2013.01); *H05K 7/20254* (2013.01); *H05K 7/20336* (2013.01); *H05K 7/20809* (2013.01)

(58) Field of Classification Search
CPC ........... H05K 7/20263; H05K 7/20254; H05K 7/20336; H05K 7/20663; H05K 7/20809; H01L 23/427
See application file for complete search history.

(56) References Cited

U.S. PATENT DOCUMENTS

| | | | |
|---|---|---|---|
| 9,894,803 B1* | 2/2018 | Artis | H05K 7/20409 |
| 10,548,239 B1* | 1/2020 | Iyengar | H05K 7/20763 |
| 10,598,441 B2* | 3/2020 | Kawabata | H01L 23/427 |
| 11,109,515 B1* | 8/2021 | Nagarajan | H01L 25/167 |
| 2002/0135980 A1* | 9/2002 | Vafai | H01L 23/427 |
| | | | 174/15.2 |

(Continued)

FOREIGN PATENT DOCUMENTS

CN    113720183 A  * 11/2021 ............. F28D 15/02

OTHER PUBLICATIONS

CN-113720183-A Translation (Year: 2021).*

*Primary Examiner* — Jayprakash N Gandhi
*Assistant Examiner* — Matthew Sinclair Muir
(74) *Attorney, Agent, or Firm* — Maschoff Brennan

(57) ABSTRACT

A liquid cooling plate assembly is configured to be in thermal contact with a first heat source and a second heat source. The liquid cooling plate assembly includes a cold plate and a plurality of heat pipes. The cold plate includes a plate body and a plurality of fins. The plate body is configured to be in thermal contact with the first heat source and the second heat source, the plate body has a fluid chamber and an inner bottom surface, the inner bottom surface is located at a bottom of the fluid chamber, and the fins protrude from the inner bottom surface. The heat pipes are located in the fluid chamber and thermally coupled to the fins, and the heat pipes are arranged side by side and are in thermal contact with one another.

8 Claims, 8 Drawing Sheets

(56) References Cited

U.S. PATENT DOCUMENTS

2007/0227711 A1\* 10/2007 Furuya .................. H01L 23/467
                                                                            257/E23.099
2022/0408544 A1\* 12/2022 Tian ...................... H01L 23/367
2024/0055321 A1\*  2/2024 Lin ....................... H01L 23/473

\* cited by examiner

LIQUID COOLING PLATE ASSEMBLY AND SERVER

CROSS-REFERENCE TO RELATED APPLICATIONS

This non-provisional application claims priority under 35 U.S.C. § 119 (a) on Patent Application No(s). 202311095596.3 filed in China, on Aug. 28, 2023, the entire contents of which are hereby incorporated by reference.

BACKGROUND OF THE INVENTION

Technical Field of the Invention

The invention relates to a liquid cooling plate assembly and a server.

Description of the Related Art

In general, a central processing unit (hereinafter "CPU") of a motherboard of a server is cooled by a cold plate. The cold plate has fins provided in an interior chamber thereof for increasing a contact surface area between cold plate and a coolant in the interior chamber, which allows the coolant to take heat away.

However, the performance of the CPU gradually increases, but the efficiency that heat is conducted to the fins is difficult to correspondingly improved, and thus the cold plate is insufficient to dissipate more heat generated by the CPU. Therefore, how to solve the aforementioned issue is one of the crucial topics in this field.

SUMMARY OF THE INVENTION

The invention provides a liquid cooling plate assembly and a server which enabling heat to be rapidly and uniformly conducted to the fins of the cold plate for increasing the heat dissipation efficiency.

One embodiment of the invention provides a liquid cooling plate assembly. The liquid cooling plate assembly is configured to be in thermal contact with a first heat source and a second heat source. The liquid cooling plate assembly includes a cold plate and a plurality of heat pipes. The cold plate includes a plate body and a plurality of fins. The plate body is configured to be in thermal contact with the first heat source and the second heat source, the plate body has a fluid chamber and an inner bottom surface, the inner bottom surface is located at a bottom of the fluid chamber, and the fins protrude from the inner bottom surface. The heat pipes are located in the fluid chamber and thermally coupled to the fins, and the heat pipes are arranged side by side and are in thermal contact with one another.

Another embodiment of the invention provides a server. The server includes a casing, a motherboard and a liquid cooling plate assembly. The casing has an accommodation space. The motherboard is located in the accommodation space and has a first heat source and a second heat source. The liquid cooling plate assembly includes a cold plate and a plurality of heat pipes. The cold plate includes a plate body and a plurality of fins. The plate body is in thermal contact with the first heat source and the second heat source, the plate body has a fluid chamber and an inner bottom surface, the inner bottom surface is located at a bottom of the fluid chamber, and the fins protrude from the inner bottom surface. The heat pipes are located in the fluid chamber and thermally coupled to the fins, and the heat pipes are arranged side by side and are in thermal contact with one another According to the liquid cooling plate assembly and the server as discussed in the above embodiments, the heat pipes are located in the fluid chamber of the cold plate and are thermally coupled to the fins, and the heat pipes are arranged side by side and are in thermal contact with one another, such that the heat pipes not only can rapidly and uniformly conduct heat absorbed by the plate body of the cold plate to the fins of the cold plate, but also additionally contact the coolant in the fluid chamber. As a result, the heat exchange efficiency between the coolant and the liquid cooling plate assembly can be improved, thereby facilitating to dissipate heat generated by the first heat source and the second heat sources away.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
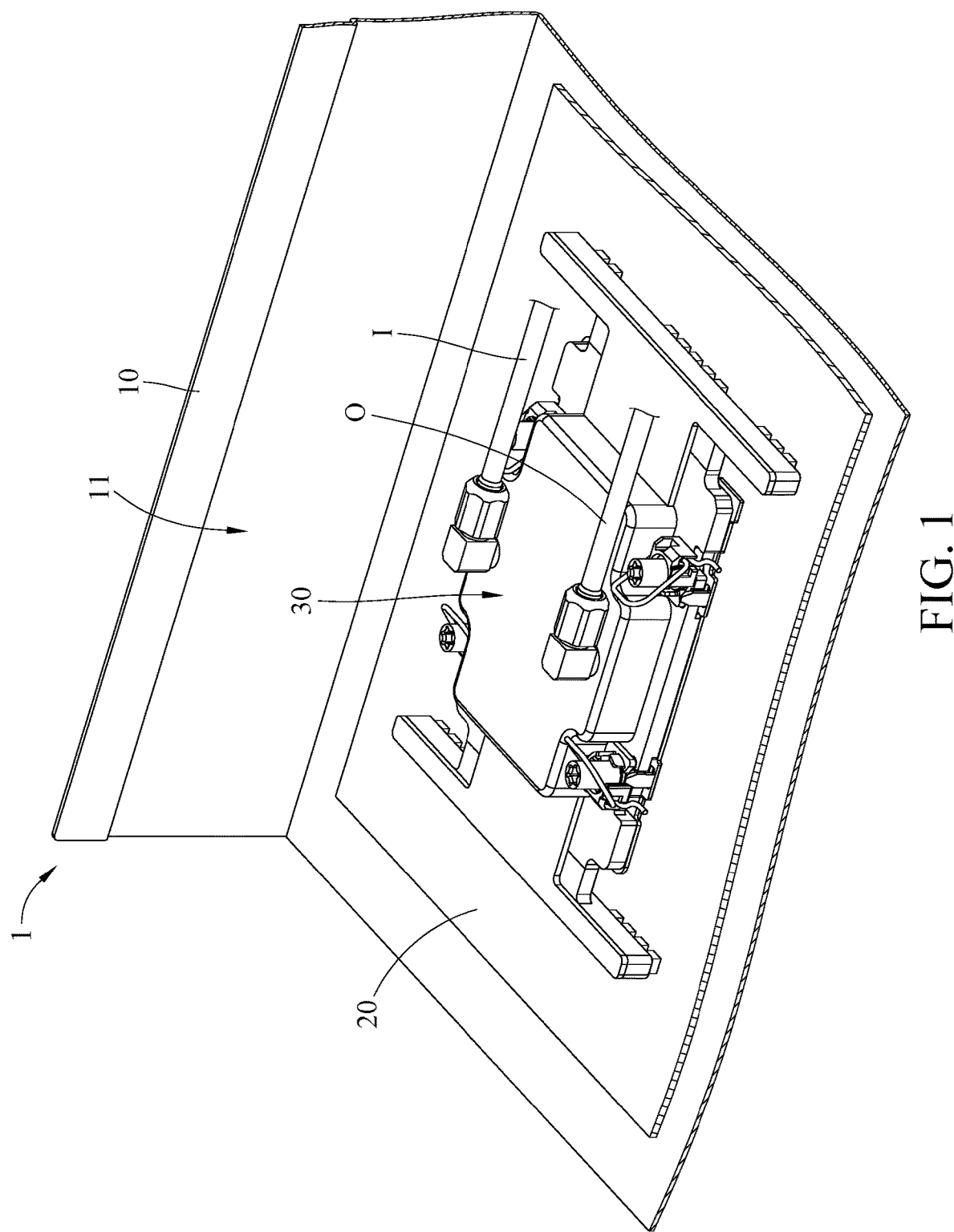
FIG. 1 is a partial perspective view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
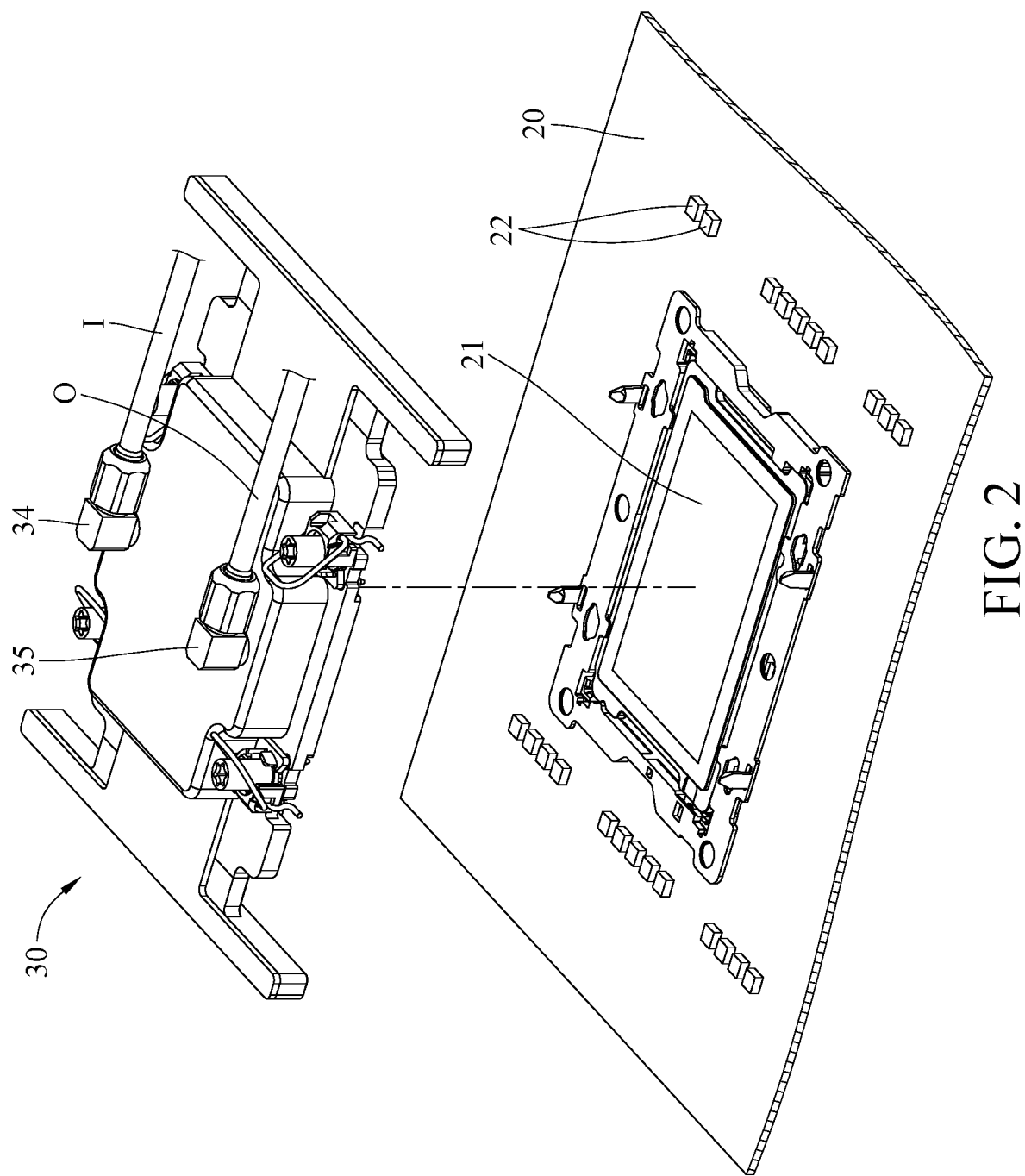
FIG. 2 is an exploded view of a liquid cooling plate assembly and a motherboard in FIG. 1.

Referring to FIGS. 1 and 2, FIG. 1 is a partial perspective view of a server 1 according to one embodiment of the invention, and FIG. 2 is an exploded view of a liquid cooling plate assembly 30 and a motherboard 20 in FIG. 1.

In this embodiment, the server 1 includes a casing 10, a motherboard 20 and a liquid cooling plate assembly 30. In addition, the server 1 may further include other components, such as hard disk drives, fans, a power supply and so on. In order to clearly show the liquid cooling plate assembly 30 of the server 1, those components are omitted in the figures.

In this embodiment, the casing 10 has an accommodation space 11, and the motherboard 20 is located in the accommodation space 11. The motherboard 20 has a first heat source 21 and a plurality of second heat sources 22. The first heat source 21 is, for example, a CPU, and the second heat sources 22 are, for example, voltage regulator chips. The second heat sources 22 are located at two opposite sides of the first heat source 21.

Figure 3:
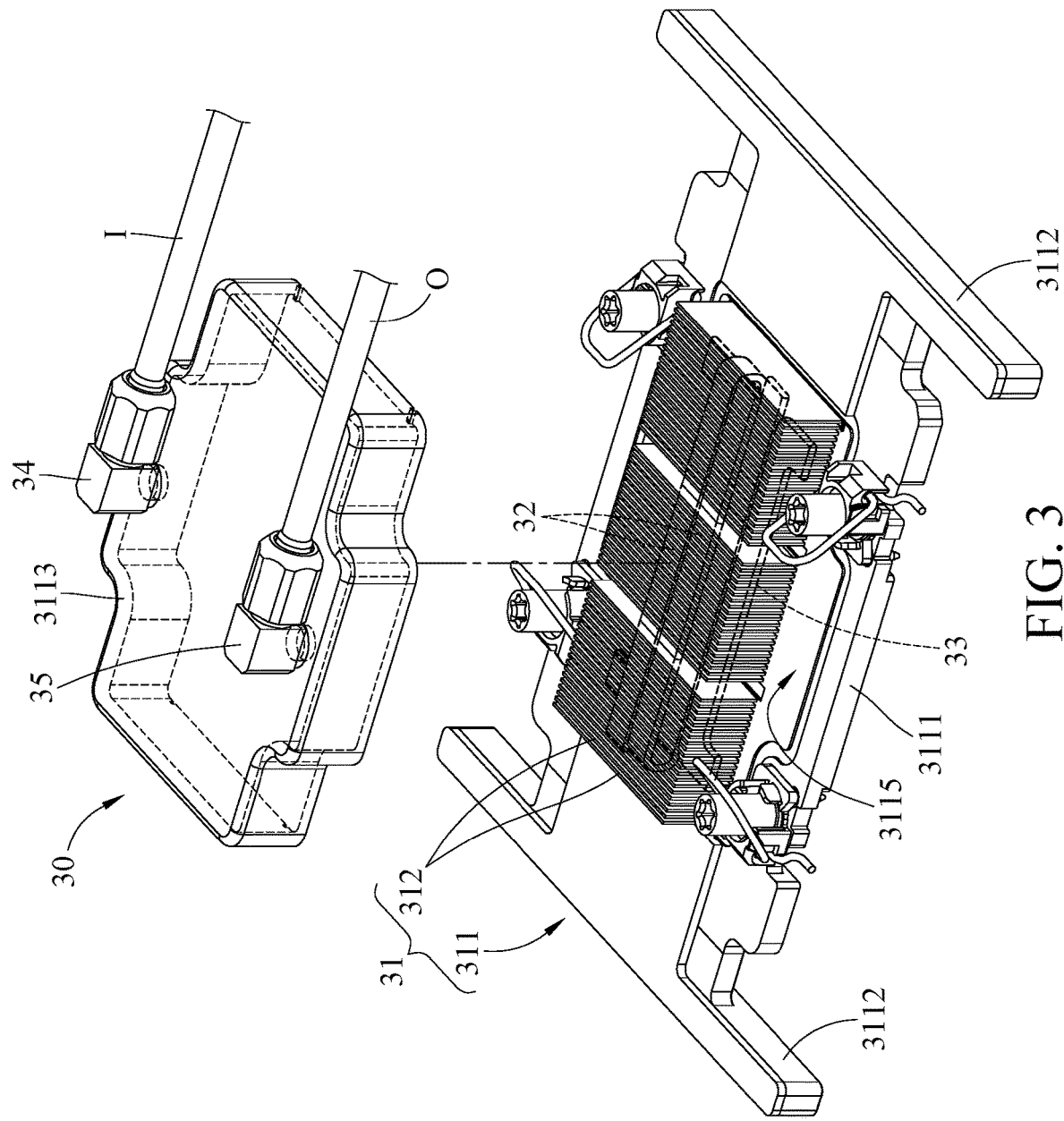
FIG. 3 is an exploded view of the liquid cooling plate assembly in FIG. 1.
Figure 4:
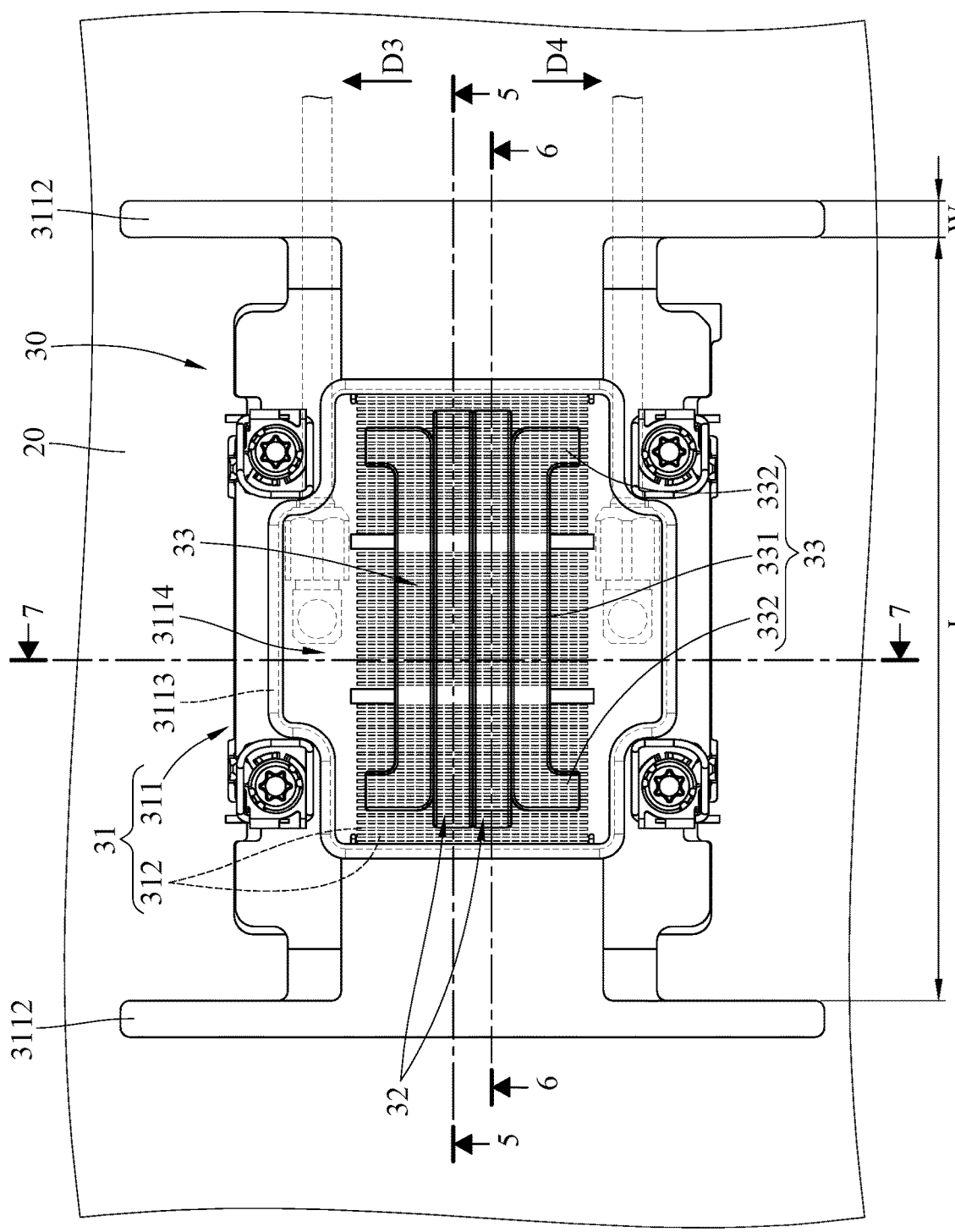
FIG. 4 is a top view of the server in FIG. 1.
Figure 5:
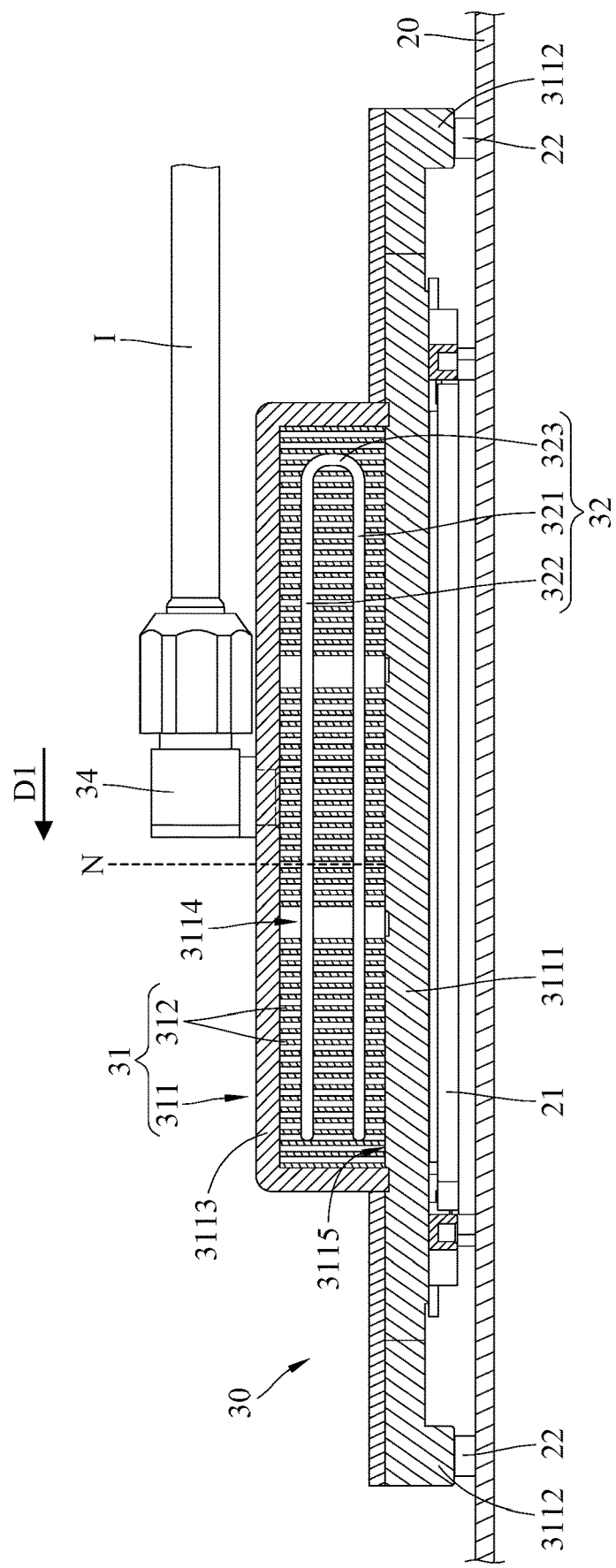
FIG. 5 is a cross-sectional view of the server in FIG. 4 taken along a line 5-5.

Then, referring to FIGS. 2 to 4, FIG. 3 is an exploded view of the liquid cooling plate assembly 30 in FIG. 1, and FIG. 4 is a top view of the server 1 in FIG. 1.

The liquid cooling plate assembly 30 includes a cold plate 31 and a plurality of heat pipes 32 and 33.

The cold plate 31 is, for example, made of metal, such as aluminum. The cold plate 31 includes a plate body 311 and a plurality of fins 312. The plate body 311 includes a first thermal contact portion 3111 and two second thermal contact portions 3112. The two second thermal contact portions 3112 are respectively connected to two opposite sides of the first thermal contact portion 3111. A length L of the first thermal contact portion 3111 is greater than a width W of each of the second thermal contact portions 3112. The first thermal contact portion 3111 is configured to be thermal contact with the first heat source 21. The two second thermal contact portions 3112 are configured to be thermal contact with the second heat sources 22.

Note that the second heat sources 22 of the motherboard 20 are not restricted to being located at two opposite sides of the first heat source 21; in some other embodiments, the second heat sources of the motherboard may all located at the same side of the first heat source, and the plate body may include only one second thermal contact portion for thermally contacting these second heat sources. In addition, the quantity of the second heat sources of the motherboard are not restricted in the invention and may be modified to one in some other embodiments. Furthermore, the length of the first thermal contact portion is not restricted to being greater than the width of the second thermal contact portion, and may be modified to be equal to or smaller than the width of the second thermal contact portion.

In this embodiment, the plate body 311 may further include a cover portion 3113. The cover portion 3113 is mounted on the first thermal contact portion 3111, and the cover portion 3113 and the first thermal contact portion 3111 together surround and form a fluid chamber 3114. The fluid chamber 3114 is configured to accommodate a coolant (not shown). A surface of the first thermal contact portion 3111 located at a bottom of the fluid chamber 3114 is an inner bottom surface 3115. The fins 312 protrude from the inner bottom surface 3115 and located in the fluid chamber 3114, and the fins 312 are arranged side by side and are parallel to one another. When the first thermal contact portion 3111 and the two second thermal contact portions 3112 absorb heat generated by the first heat source 21 and the second heat sources 22, heat is conducted to the fins 312, such that the coolant in the fluid chamber 3114 performs heat exchange with the fins 312.

Figure 6:
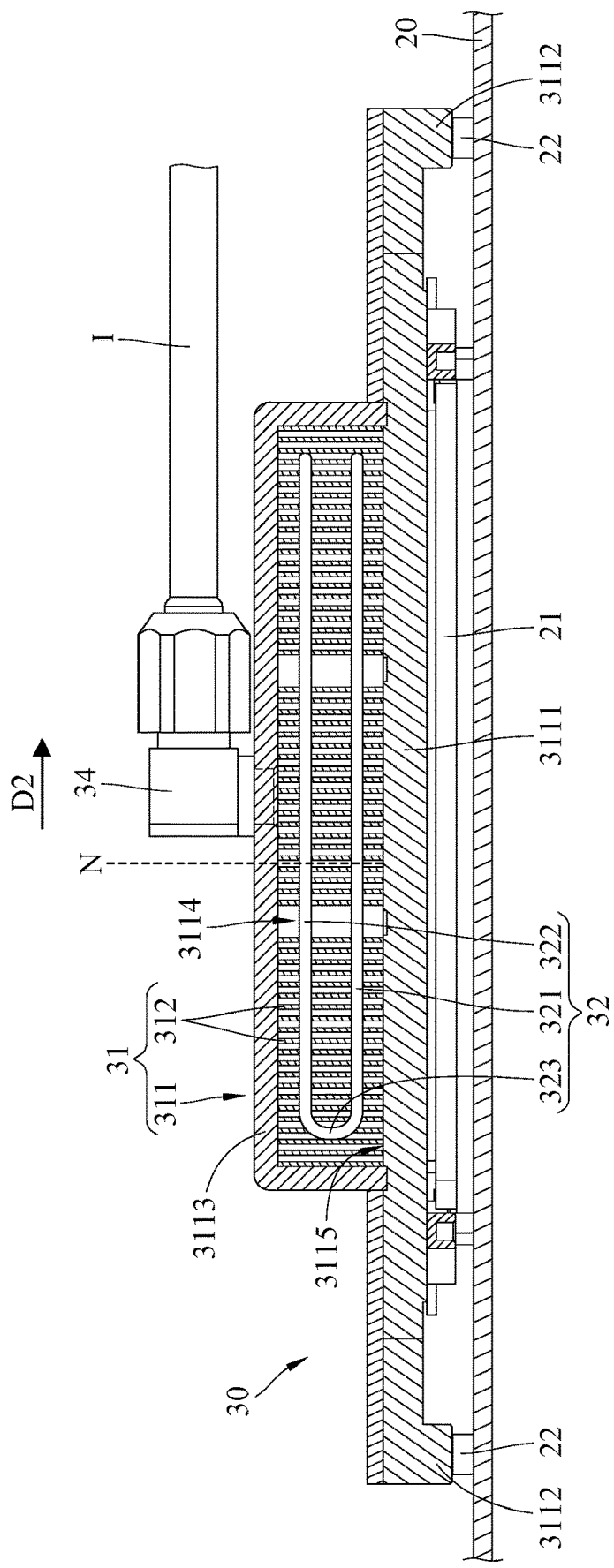
FIG. 6 is a cross-sectional view of the server in FIG. 4 taken along a line 6-6.
Figure 7:
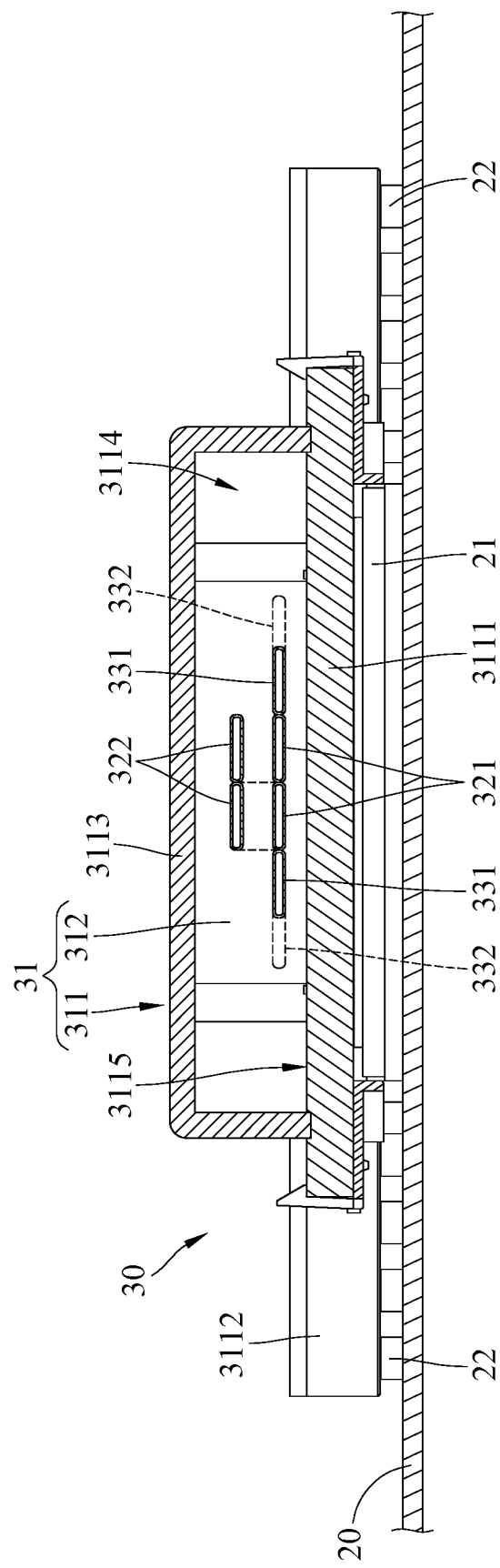
FIG. 7 is a cross-sectional view of the server in FIG. 4 taken along a line 7-7.

Then, referring to FIGS. 4 to 7, FIG. 5 is a cross-sectional view of the server 1 in FIG. 4 taken along a line 5-5, FIG. 6 is a cross-sectional view of the server 1 in FIG. 4 taken along a line 6-6, and FIG. 7 is a cross-sectional view of the server 1 in FIG. 4 taken along a line 7-7.

The heat pipes 32 and 33 are, for example but not limited to, flat heat pipes. The heat pipes 32 and 33 are located in the fluid chamber 3114, and the heat pipes 32 and 33 are disposed through some of the fins 312 and are thermally coupled to the fins 312. The heat pipes 32 and 33 are arranged side by side and are in thermal contact with one another. The following paragraphs will introduce the structures of the heat pipes 32 and 33 and the contact relationship between them.

The heat pipes 32 and 33 include two first heat pipes 32 and two second heat pipes 33, and the two first heat pipes 32 are located between the two second heat pipes 33.

The two first heat pipes 32 are the same in structure, and thus only one of them will be introduced in detail. The first heat pipe 32 includes a first horizontal portion 321, a second horizontal portion 322 and a vertical portion 323. The first horizontal portion 321 and the second horizontal portion 322 are respectively connected to two opposite ends of the vertical portion 323 and extend along a same direction, and the second horizontal portion 322 is located farther away from the inner bottom surface 3115 than the first horizontal portion 321. In other word, the first heat pipe 32 has the first horizontal portion 321 and the second horizontal portion 322 which extend horizontally in different altitudes relative to the inner bottom surface 3115, and further has the vertical portion 323 which extend vertically along a normal line N of the inner bottom surface 3115.

In this embodiment, a direction D1 that the first horizontal portion 321 and the second horizontal portion 322 extend from the vertical portion 323 in one of the first heat pipes 32 is, for example, opposite to a direction D2 that the first horizontal portion 321 and the second horizontal portion 322 extend from the vertical portion 323 in the other one of the first heat pipes 32, but the invention is not limited thereto; in some other embodiments, the direction that the first horizontal portion and the second horizontal portion extend from the vertical portion in one of the first heat pipes may be same as the direction that the first horizontal portion and the second horizontal portion extend from the vertical portion in the other one of the first heat pipes.

The two second heat pipes 33 are the same in structure, and thus only one of them will be introduced in detail. The second heat pipe 33 includes a first horizontal portion 331 and two second horizontal portions 332. The two second horizontal portions 332 are respectively connected to two opposite ends of the first horizontal portion 331 and extend from the first horizontal portion 331 along a same direction. The first horizontal portion 331 and the two second horizontal portions 332 of the second heat pipe 33 are distanced from the inner bottom surface 3115 by a same distance. In other words, the second heat pipe 33 entirely extend horizontally in the same altitude relative to the inner bottom surface 3115, and the second heat pipe 33 has the first horizontal portion 331 and the second horizontal portions 332 which extend along different directions at the same altitude relative to the inner bottom surface 3115.

In this embodiment, a direction D3 that the two second horizontal portions 332 extend from the first horizontal portion 331 in one of the second heat pipes 33 is, for example, opposite to a direction D4 that the two second horizontal portions 332 extend from the first horizontal portion 331 in the other one of the second heat pipes 33, but the invention is not limited thereto; in some other embodiments, the direction that the two second horizontal portions extend from the first horizontal portion in one of the second heat pipes may be same as the direction that the two second horizontal portions extend from the first horizontal portion in the other one of the second heat pipes.

In this embodiment, the first horizontal portions 321 of the two first heat pipes 32 and the first horizontal portions 331 of the two second heat pipes 33 are distanced from the inner bottom surface 3115 by the same distance (that is, they have the same altitude relative to the inner bottom surface 3115), and extend along the same direction (e.g., the direction D1 or D2). In addition, the first horizontal portions 321 of the two first heat pipes 32 are located between the first horizontal portions 331 of the two second heat pipes 33, and the first horizontal portions 321 of the two first heat pipes 32 and the first horizontal portions 331 of the two second heat pipes 33 are arranged side by side and are in thermal contact with one another.

In this embodiment, the liquid cooling plate assembly 30 may further include an inlet joint 34 and an outlet joint 35. The inlet joint 34 and the outlet joint 35 are disposed on the cover portion 3113 of the plate body 311 of the cold plate 31, and are in fluid communication with the fluid chamber 3114. The inlet joint 34 is configured to be connected to an inlet pipe I, and the outlet joint 35 is configured to be connected to an outlet pipe O. The inlet pipe I, the inlet joint 34, the cold plate 31, the outlet joint 35 and the outlet pipe O may form a loop for the coolant with a pump (not shown) and a heat radiator (not shown). The pump can drive the coolant to flow into the fluid chamber 3114 of the cold plate 31 through the inlet pipe I and the inlet joint 34, such that the coolant may perform heat exchange with the fins 312 and the heat pipes 32 and 33 and thus carries heat. Then, the coolant carrying heat flows to the heat radiator through the outlet joint 35 and the outlet pipe O so as to be cooled. As a result, by repeating the aforementioned processes, heat generated by the first heat source 21 and the second heat sources 22 can be taken away and dissipated.

In this embodiment, the heat pipes 32 and 33 are located in the fluid chamber 3114 of the cold plate 31 and are thermally coupled to the fins 312, and the heat pipes 32 and 33 are arranged side by side and are in thermal contact with one another, such that the heat pipes 32 and 33 not only can rapidly and uniformly conduct heat absorbed by the plate body 311 of the cold plate 31 to the fins 312 of the cold plate 31, but also additionally contact the coolant in the fluid chamber 3114. As a result, the heat exchange efficiency between the coolant and the liquid cooling plate assembly 30 can be improved, thereby facilitating to dissipate heat generated by the first heat source 21 and the second heat sources 22 away.

Furthermore, the heat pipes 32 and 33 are disposed through the fins 312, which can conduct heat to the fins 312 of the cold plate 31 more rapidly and uniformly, thereby further improving the heat exchange efficiency between the coolant and the liquid cooling plate assembly 30.

Note that the heat pipes 32 and 33 are not restricted to being merely disposed through some of the fins 312. In some other embodiments, the heat pipes may be disposed through all of the fins. In another embodiment, the heat pipes may be not disposed through the fins and may be merely in thermal contact with the fins.

In this embodiment, the first horizontal portions 321 and 331 of the first heat pipes 32 and the second heat pipes 33 are distanced from the inner bottom surface 3115 by the same altitude and extend along the same direction, the first heat pipes 32 further have the vertical portions 323 vertically extending along the normal line N of the inner bottom surface 3115 and the second horizontal portions 322 having altitudes different from that of the first horizontal portions 321, and the second heat pipes 33 further have the second horizontal portions 332 having the same altitude as that of the first horizontal portions 331 but extending along a direction different from that of the first horizontal portions 331. As a result, the heat pipes 32 and 33 not only can conduct heat to the fins 312 of the cold plate 31 more rapidly and uniformly, but also have more surface areas for contacting the coolant, thereby further improving the heat exchange efficiency between the coolant and the liquid cooling plate assembly 30 for further facilitating to dissipate heat generated by the first heat source 21 and the second heat sources 22 away. For example, from simulation results, the cold plate 31 with the heat pipes 32 and 33 can maintain the operation temperature of the first heat source 21 to fall within a range from 55.3° C. to 55.8° C., while the cold plate without any heat pipe merely maintain the operation temperature of the first heat source 21 to fall within a range from 58.1° C. to 59.5° C. Therefore, the arrangements of the heat pipes 32 and 33 can facilitate to dissipate heat generated by the first heat source 21 away for effectively reducing the operation temperature of the first heat source 21.

Figure 8:
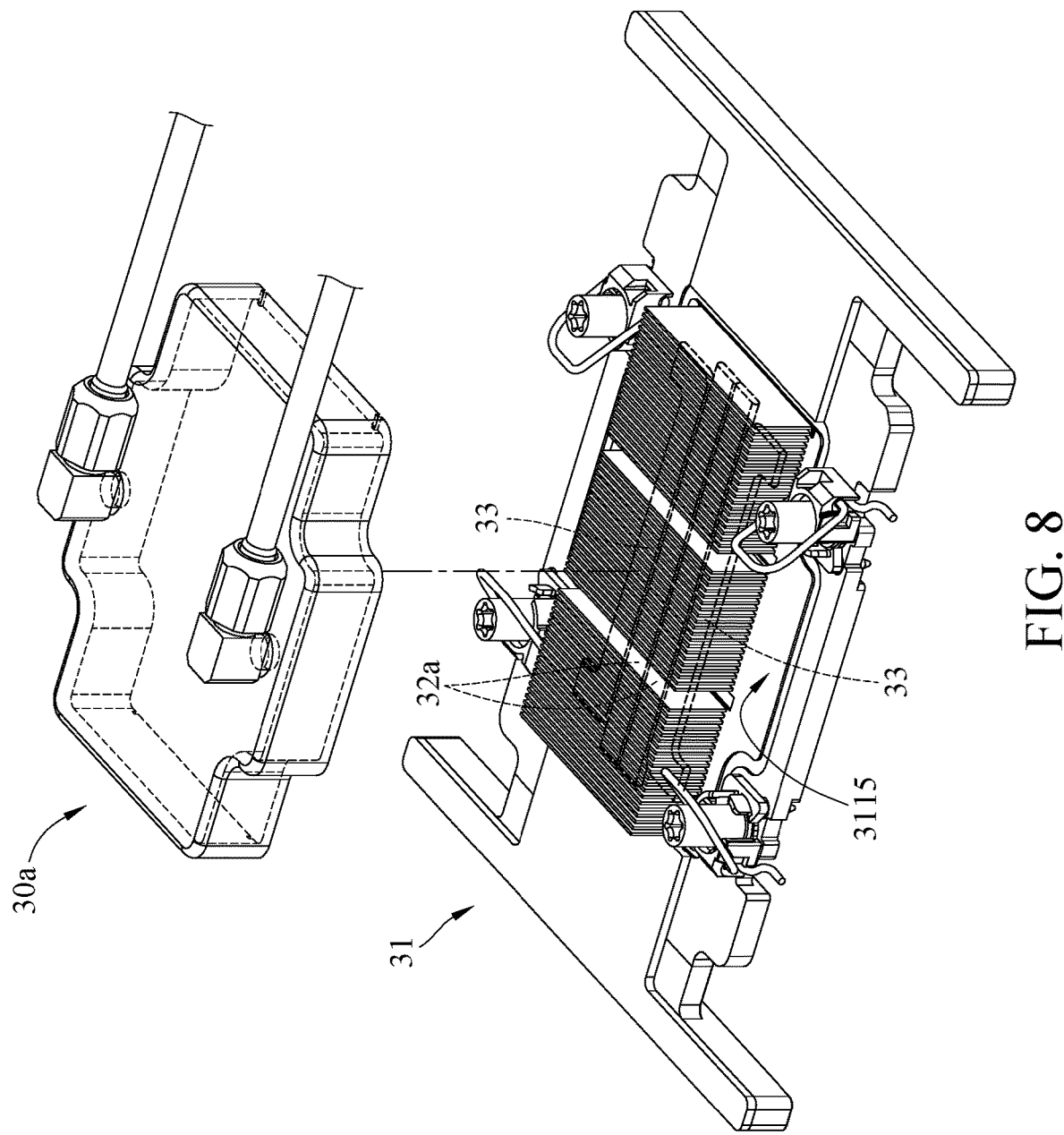
FIG. 8 is an exploded view of a liquid cooling plate assembly according to another embodiment of the invention.

Then, referring to FIG. 8, FIG. 8 is an exploded view of a liquid cooling plate assembly 30*a* according to another embodiment of the invention.

The liquid cooling plate assembly 30*a* of this embodiment is similar to the liquid cooling plate assembly 30 of the previous embodiment, the main difference between them is the structures of the two first heat pipes, and thus the following paragraphs mainly introduce two first heat pipe 32*a* of the liquid cooling plate assembly 30*a* of this embodiment while the same parts between them will not be introduced repeatedly hereinafter.

In this embodiment, each of the first heat pipes 32*a* of the liquid cooling plate assembly 30*a* does not include the vertical portion and the second horizontal portion; that is, the first heat pipes 32*a* are in a straight bar shape, and the first heat pipes 32*a* and the second heat pipe 33 are entirely located in the same altitude relative the inner bottom surface 3115 located at the bottom of the fluid chamber 3114 (as shown in FIG. 7).

From simulation results, the cold plate 31 with the heat pipes 32*a* and 33 can maintain the operation temperature of the first heat source 21 (as shown in FIG. 2) to fall within a range from 56.3° C. to 56.9° C., while the cold plate without any heat pipe merely maintain the operation temperature of the first heat source 21 to fall within a range from 58.1° C. to 59.5° C. Therefore, the arrangements of the heat pipes 32*a* and 33 can facilitate to dissipate heat generated by the first heat source 21 for effectively reducing the operation temperature of the first heat source 21.

According to the liquid cooling plate assemblies and the server as discussed in the above embodiments, the heat pipes are located in the fluid chamber of the cold plate and are thermally coupled to the fins, and the heat pipes are arranged side by side and are in thermal contact with one another, such that the heat pipes not only can rapidly and uniformly conduct heat absorbed by the plate body of the cold plate to the fins of the cold plate, but also additionally contact the coolant in the fluid chamber. As a result, the heat exchange efficiency between the coolant and the liquid cooling plate assembly can be improved, thereby facilitating to dissipate heat generated by the first heat source and the second heat sources away.

Furthermore, the heat pipes are disposed through the fins, which can conduct heat to the fins of the cold plate more rapidly and uniformly, thereby further improving the heat exchange efficiency between the coolant and the liquid cooling plate assembly.

Moreover, the first horizontal portions of the first heat pipes and the second heat pipes are distanced from the inner bottom surface by the same altitude and extend along the same direction, the first heat pipes further have the vertical portions vertically extending along the normal line of the inner bottom surface and the second horizontal portions having altitudes different from that of the first horizontal portions, and the second heat pipes further have the second horizontal portions having the same altitude as that of the first horizontal portions but extending along a direction different from that of the first horizontal portions. As a result, the heat pipes not only can conduct heat to the fins of the cold plate more rapidly and uniformly, but also have more surface areas for contacting the coolant, thereby further improving the heat exchange efficiency between the coolant and the liquid cooling plate assembly for further facilitating to dissipate heat generated by the first heat source and the second heat sources away.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid cooling plate assembly, configured to be in thermal contact with a first heat source and a second heat source, the liquid cooling plate assembly comprising:
    a cold plate, comprising a plate body and a plurality of fins, wherein the plate body is configured to be in thermal contact with the first heat source and the second heat source, the plate body has a fluid chamber and an inner bottom surface, the inner bottom surface is located at a bottom of the fluid chamber, and the plurality of fins protrude from the inner bottom surface; and
    a plurality of heat pipes, located in the fluid chamber and thermally coupled to the plurality of fins, wherein the plurality of heat pipes are arranged side by side and are in thermal contact with one another;
    wherein the plurality of heat pipes comprises two first heat pipes and two second heat pipes, the two first heat pipes are located between the two second heat pipes, each of the two first heat pipes and the two second heat pipes comprises a first horizontal portion, the first horizontal portions of the two first heat pipes and the two second heat pipes are distanced from the inner bottom surface by a same distance and extend along a same direction, each of the two second heat pipes further comprises two second horizontal portions; and in each of the two second heat pipes, the two second horizontal portions are respectively connected to two opposite ends of the first horizontal portion and extend from the first horizontal portion along a same direction.

2. The liquid cooling plate assembly according to claim 1, wherein the plurality of heat pipes are disposed through at least some of the plurality of fins.

3. The liquid cooling plate assembly according to claim 1, wherein a direction that the two second horizontal portions extend from the first horizontal portion in one of the two second heat pipes is opposite to a direction that the two second horizontal portions extend from the first horizontal portion in the other one of the two second heat pipes.

4. The liquid cooling plate assembly according to claim 1, wherein each of the two first heat pipes further comprises a vertical portion and a second horizontal portion; in each of the two first heat pipes, the first horizontal portion and the second horizontal portion are respectively connected to two opposite ends of the vertical portion and extend along a same direction, and the second horizontal portion is located farther away from the inner bottom surface than the first horizontal portion.

5. The liquid cooling plate assembly according to claim 4, wherein a direction that the first horizontal portion extends from the vertical portion in one of the two first heat pipes is opposite to a direction that the first horizontal portion extends from the vertical portion in the other one of the two first heat pipes.

6. The liquid cooling plate assembly according to claim 1, wherein the plate body comprises a first thermal contact portion and a second thermal contact portion connected to each other, the first thermal contact portion is configured to be in thermal contact with the first heat source, the second thermal contact portion is configured to be in thermal contact with the second heat source, and a length of the first thermal contact portion is greater than a width of the second thermal contact portion.

7. The liquid cooling plate assembly according to claim 1, wherein the plurality of heat pipes are flat heat pipes.

8. A server, comprising:
    a casing, having an accommodation space;
    a motherboard, located in the accommodation space and having a first heat source and a second heat source; and
    a liquid cooling plate assembly, comprising:
        a cold plate, comprising a plate body and a plurality of fins, wherein the plate body is in thermal contact with the first heat source and the second heat source, the plate body has a fluid chamber and an inner bottom surface, the inner bottom surface is located at a bottom of the fluid chamber, and the plurality of fins protrude from the inner bottom surface; and
        a plurality of heat pipes, located in the fluid chamber and thermally coupled to the plurality of fins, wherein the plurality of heat pipes are arranged side by side and are in thermal contact with one another;
    wherein the plurality of heat pipes comprises two first heat pipes and two second heat pipes, the two first heat pipes are located between the two second heat pipes, each of the two first heat pipes and the two second heat pipes comprises a first horizontal portion, the first horizontal portions of the two first heat pipes and the two second heat pipes are distanced from the inner bottom surface by a same distance and extend along a same direction, each of the two second heat pipes further comprises two second horizontal portions; and in each of the two second heat pipes, the two second horizontal portions are respectively connected to two opposite ends of the first horizontal portion and extend from the first horizontal portion along a same direction.

* * * * *